(12) United States Patent
Takaoka et al.

(10) Patent No.: US 8,978,469 B2
(45) Date of Patent: Mar. 17, 2015

(54) PIEZOELECTRIC THIN FILM STRUCTURE AND ANGULAR VELOCITY DETECTION APPARATUS

(75) Inventors: Masaki Takaoka, Kyoto (JP); Daisuke Kaminishi, Kyoto (JP); Mizuho Okada, Kyoto (JP); Nobuhisa Yamashita, Kyoto (JP)

(73) Assignee: Rohm Co., Ltd., Kyoto (JP)

(*) Notice: Subject to any disclaimer, the term of this patent is extended or adjusted under 35 U.S.C. 154(b) by 448 days.

(21) Appl. No.: 13/436,931

(22) Filed: Mar. 31, 2012

(65) Prior Publication Data
US 2012/0247207 A1 Oct. 4, 2012

(30) Foreign Application Priority Data
Apr. 1, 2011 (JP) .................................. 2011-82057

(51) Int. Cl.
*G01C 19/56* (2012.01)
*G01C 19/5769* (2012.01)
*H01L 41/08* (2006.01)
*H01L 41/113* (2006.01)

(52) U.S. Cl.
CPC ........ *G01C 19/5769* (2013.01); *H01L 41/0815* (2013.01); *H01L 41/1132* (2013.01)
USPC ....................................................... 73/504.12

(58) Field of Classification Search
CPC ........................... G01C 19/574; H01L 41/1132
USPC ........................................ 73/504.12; 310/329
See application file for complete search history.

(56) References Cited

U.S. PATENT DOCUMENTS

| | | | | |
|---|---|---|---|---|
| 8,322,830 B2 * | 12/2012 | Takakuwa | ........................ | 347/71 |
| 8,714,713 B2 * | 5/2014 | Nawano | .......................... | 347/68 |
| 2009/0201337 A1 * | 8/2009 | Li | .................................. | 347/44 |

FOREIGN PATENT DOCUMENTS

| | | | |
|---|---|---|---|
| JP | 11-351874 A | | 12/1999 |
| JP | 2003-264320 | * | 9/2003 |

* cited by examiner

*Primary Examiner* — John Chapman, Jr.
(74) *Attorney, Agent, or Firm* — Rabin & Berdo, P.C.

(57) ABSTRACT

A piezoelectric thin film structure includes a substrate, a silicon oxide film disposed on the substrate, a first aluminum oxide film disposed on the silicon oxide film, a lower electrode layer disposed on the first aluminum oxide film, a piezoelectric film layer disposed on the lower electrode layer, and an upper electrode layer disposed on the piezoelectric film layer.

8 Claims, 10 Drawing Sheets

PIEZOELECTRIC THIN FILM STRUCTURE AND ANGULAR VELOCITY DETECTION APPARATUS

CROSS-REFERENCE TO RELATED APPLICATION

This application is based upon and claims the benefit of priority from Japanese Patent Application No. 2011-82057, filed on Apr. 1, 2011, the entire contents of which are incorporated herein by reference.

TECHNICAL FIELD

The present disclosure relates to a piezoelectric thin film structure and an angular velocity detection apparatus, and more particularly, to a piezoelectric thin film structure whose piezoelectric properties are stabilized and an angular velocity detection apparatus using the piezoelectric thin film structure, capable of reducing an impact of oscillation noise.

BACKGROUND

As an angular velocity detection apparatus, oscillation type angular velocity detection apparatuses of various shapes, such as a tuning bar type and tuning fork type, have been proposed and practically used. For example, a tuning fork type angular velocity detection apparatus has a high Q-value, and thus, stable oscillation and high sensitivity can be obtained.

There has been proposed a tuning fork type angular velocity detection apparatus in which a driving electrode to which a driving voltage for oscillating an arm (oscillator) is applied and a detection electrode that outputs a detection signal according to an angular velocity applied to the arm are formed on the same arm.

In the angular velocity detection apparatus described above, if an oscillation direction of the arm is a horizontal direction, a detection direction is a vertical direction; and in a state where an angular velocity is not applied to the arm, a detection signal is not outputted from the detection electrode. Further, when an angular velocity is applied to the arm while the arm oscillates in the horizontal direction, the arm also oscillates in the vertical direction by Coriolis force, and the angular velocity is detected based on the oscillation in the vertical direction.

Meanwhile, a piezoelectric thin film structure applied to the oscillator of a conventional angular velocity detection apparatus includes a three-layer structure consisting of an oxide layer ($SiO_2$ layer), a platinum (Pt) layer disposed on the $SiO_2$ layer, and a lead zirconate titanate (PZT: $Pb(Zr_x, Ti_{1-x})O_3$) layer disposed on the Pt layer. The $SiO_2$ layer serves as a layer for preventing the diffusion of Pb from the PZT layer.

However, in the above piezoelectric thin film structure applied to the oscillator of a conventional angular velocity detection apparatus, a lead (Pb) component in the PZT may be diffused into a substrate in a firing process during film formation, and the piezoelectric performance may deteriorate. Thus, the sensitivity of a sensor of the angular velocity detection apparatus may also deteriorate.

SUMMARY

The present disclosure provides some embodiments of a piezoelectric thin film structure whose piezoelectric properties are stabilized by suppressing the diffusion of Pb from a PZT film and an angular velocity detection apparatus using the piezoelectric thin film structure, capable of improving a S/N ratio.

According to one embodiment of the present disclosure, provided is a piezoelectric thin film structure including a substrate, a silicon oxide film disposed on the substrate, a first aluminum oxide film disposed on the silicon oxide film, a lower electrode layer disposed on the first aluminum oxide film, a piezoelectric film layer disposed on the lower electrode layer, and an upper electrode layer disposed on the piezoelectric film layer.

According to another embodiment of the present disclosure, provided is an angular velocity detection apparatus including a substrate having a cavity; first and second oscillation arms arranged in parallel in the cavity, the first and second oscillation arms oscillating in opposite directions along a driving oscillation direction perpendicular to a thickness direction of the substrate and orthogonal to a long-axis direction along which the first and second oscillation arms are extended; first and second connecting portions configured to connect the first and second oscillation arms, one end of the first oscillation arm being connected to the opposing end of the second oscillation arm through the first connecting portion and the other end of the first oscillation arm being connected to the opposing end of the second oscillation arm through the second connecting portion; first and second detection arms, the first detection arm having one end connected to the first connecting portion and the other end fixed to a peripheral portion surrounding the cavity of the substrate, and the second detection arm having one end connected to the second connecting portion and the other end fixed to the peripheral portion surrounding the cavity of the substrate; and a detection circuit which detects the shape deformation of the first and second detection arms caused by oscillation of the first and second oscillation arms in the long-axis direction and detects an angular velocity applied to the first and second oscillation arms, wherein each of the first and second oscillation arms and the first and second detection arms includes a silicon oxide film disposed on the substrate, a first aluminum oxide film disposed on the silicon oxide film, a lower electrode layer disposed on the first aluminum oxide film, a piezoelectric film layer disposed on the lower electrode layer, and an upper electrode layer disposed on the piezoelectric film layer.

DETAILED DESCRIPTION

Figure 1A:
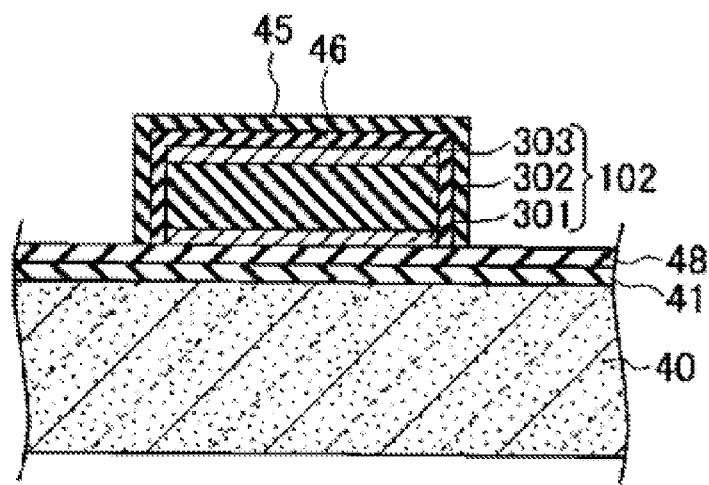
FIG. 1A illustrates a schematic cross-sectional structure of a piezoelectric thin film structure in accordance with some embodiments.

Hereinafter, embodiments of the present disclosure will be described with reference to the drawings.

In the descriptions of the drawings, the same or similar reference numerals are assigned to the same or similar parts. However, it should be noted that the drawings are schematically shown and a relationship between a thickness and a planar dimension, a ratio of the thickness of each layer, or the like in the drawings may be different from a real one. Therefore, detailed thicknesses and dimensions should be determined considering the following description.

Further, an exemplary apparatus and method for embodying the technical idea of the present disclosure will be described in the embodiments, and the embodiments of the present disclosure are not intended to limit the arrangement, structures, shapes, and materials of components to those described in the embodiments. In the embodiments of the present disclosure, various changes can be made within the scope of the claims.

Embodiments (Piezoelectric Thin Film Structure)

A schematic cross-sectional structure of a piezoelectric thin film structure in accordance with some embodiments includes, as shown in FIG. 1A, a substrate 40, a silicon oxide film 41 disposed on the substrate 40, a first aluminum oxide film 48 disposed on the silicon oxide film 41, a lower electrode layer 301 disposed on the first aluminum oxide film 48, a piezoelectric film layer 302 disposed on the lower electrode layer 301, an upper electrode layer 303 disposed on the piezoelectric film layer 302, and a second aluminum oxide film 46 disposed on the upper electrode layer 303.

Further, in the piezoelectric thin film structure in accordance with the embodiments, the second aluminum oxide film 46 may also be disposed on a sidewall of a stack structure consisting of the lower electrode layer 301, the piezoelectric film layer 302 and the upper electrode layer 303.

The piezoelectric thin film structure in accordance with the embodiments may further include a passivation film 45 disposed on the second aluminum oxide film 46.

In addition, in the piezoelectric thin film structure in accordance with the embodiments, the piezoelectric film layer 302 may be formed of a lead zirconate titanate (PZT) film or lanthanum-doped lead zirconate titanate (PLZT) film.

Figure 1B:
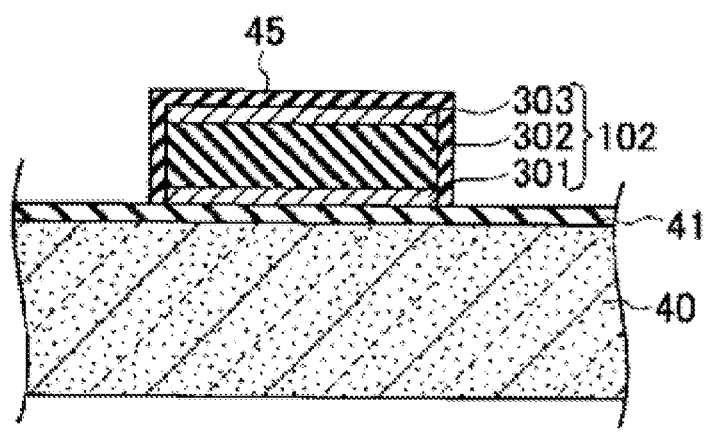
FIG. 1B illustrates a schematic cross-sectional structure of a piezoelectric thin film structure in accordance with a comparison example.

A schematic cross-sectional structure of a piezoelectric thin film structure in accordance with a comparison example includes, as shown in FIG. 1B, a substrate 40, a silicon oxide film 41 disposed on the substrate 40, a lower electrode layer 301 disposed on the silicon oxide film 41, a piezoelectric film layer 302 disposed on the lower electrode layer 301, an upper electrode layer 303 disposed on the piezoelectric film layer 302, and a passivation film 45 disposed on the upper electrode layer 303.

Upon comparison, the piezoelectric thin film structure in accordance with the embodiments includes a "four-layer structure" consisting of the silicon oxide film 41, the first aluminum oxide film 48 disposed on the silicon oxide film 41, the lower electrode layer 301 disposed on the first aluminum oxide film 48, and the piezoelectric film layer 302 disposed on the lower electrode layer 301. Since the piezoelectric thin film structure in accordance with the embodiments includes the first aluminum oxide film 48 between the silicon oxide film 41 and the lower electrode layer 301, it is possible to suppress a component, i.e., lead component of the piezoelectric film layer 302 from being diffused into the silicon oxide film 41.

Further, since the piezoelectric thin film structure in accordance with the embodiments includes the second aluminum oxide film 46 on the upper electrode layer 303, it is possible to suppress a component of the piezoelectric film layer 302 from being diffused into the passivation film 45.

According to the embodiments, it is possible to provide a piezoelectric thin film structure whose piezoelectric properties are stabilized by suppressing the diffusion of Pb from the PZT film.

(Angular Velocity Detection Apparatus)

Figure 2:
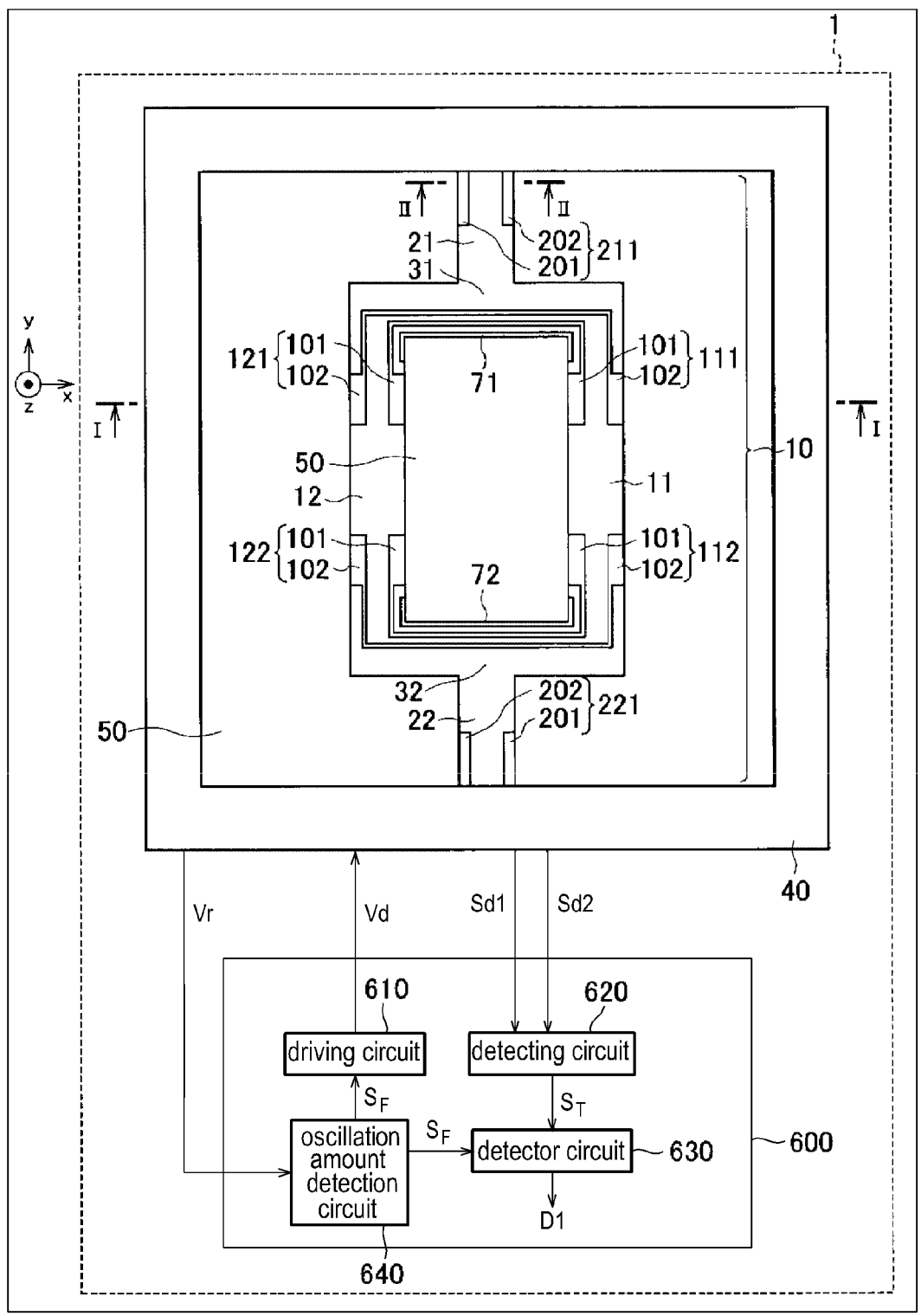
FIG. 2 is a plan view showing a schematic configuration of an angular velocity detection apparatus using the piezoelectric thin film structure in accordance with the embodiments.

As shown in FIG. 2, an angular velocity detection apparatus 1 using the piezoelectric thin film structure in accordance with the embodiments includes a substrate 40 having a cavity 50, and a pair of oscillation arms 11 and 12, whose ends are coupled to each other through connecting portions 31 and 32 such that the oscillation arms 11 and 12 are arranged in parallel in the cavity 50. In particular, as shown in FIG. 2, one end of the oscillation arm 11 is connected to the opposing end of the oscillation arm 12 through the connecting portion 31, and the other end of the oscillation arm 11 is connected to the other opposing end of the oscillation arm 12 through the connecting portion 32. The oscillation arms 11 and 12 are configured to oscillate in opposite directions along a driving oscillation direction perpendicular to a thickness direction of the substrate 40 and orthogonal to a long-axis direction along which the oscillation arms 11 and 12 are extended. The angular velocity detection apparatus 1 further includes two detection arms 21 and 22, each arm having one end connected to either of the connecting portion 31 or 32 and the other end fixed to a peripheral portion surrounding the cavity 50 of the substrate 40, and a detection circuit 600 that detects shape deformation of the detection arms 21 and 22 caused by oscillation of the oscillation arms 11 and 12 in the long-axis direction and also detects an angular velocity applied to the oscillation arms 11 and 12. Here, the oscillation arms 11 and 12 and the detection arms 21 and 22 include, as shown in FIG. 1A, the silicon oxide film 41 disposed on the substrate 40, the first aluminum oxide film 48 disposed on the silicon oxide film 41, the lower electrode layer 301 disposed on the first aluminum oxide film 48, the piezoelectric film layer 302 disposed on the lower electrode layer 301, and the upper electrode layer 303 disposed on the piezoelectric film layer 302.

Further, the oscillation arms 11 and 12 and the detection arms 21 and 22 may include the second aluminum oxide film 46 disposed on the upper electrode layer 303, as shown in FIG. 1A. Here, the second aluminum oxide film 46 may also be disposed, in the same manner as in FIG. 1A, on a sidewall of a stack structure consisting of the lower electrode layer 301, the piezoelectric film layer 302 and the upper electrode layer 303.

Further, the oscillation arms 11 and 12 and the detection arms 21 and 22 may further include the passivation film 45 disposed on the second aluminum oxide film 46, as shown in FIG. 1A.

The piezoelectric film layer 302 may be formed of a lead zirconate titanate (PZT) film, or lanthanum-doped lead zirconate titanate (PLZT) film.

The oscillation arms 11 and 12 oscillate in the driving oscillation direction by a drive signal inputted from the outside (hereinafter, referred to as "driving oscillation"). The "driving oscillation direction" is a direction parallel to the drawing surface of FIG. 2 and perpendicular to the long-axis direction along which the oscillation arms 11 and 12 are extended. In FIG. 2, the driving oscillation direction is an x-axis direction and the long-axis direction along which the oscillation arms 11 and 12 are extended is a y-axis direction. In other words, a driving oscillation plane including the driving oscillation direction is an x-y plane. Further, a normal direction of the driving oscillation plane is a z-axis direction.

As shown in FIG. 2, one end of the oscillation arm 11 is connected to the opposing end of the oscillation arm 12 through the connecting portion 31, and the other end of the oscillation arm 11 is connected to the other opposing end of the oscillation arm 12 through the connecting portion 32. One end of the detection arm 21 is connected to the connecting portion 31 between the oscillation arm 11 and the oscillation arm 12, and the other end of the detection arm 21 is fixedly connected to the peripheral portion surrounding the cavity 50 of the substrate 40 and having a frame shape. Further, one end of the detection arm 22 is connected to the connecting portion 32 between the oscillation arm 11 and the oscillation arm 12, and the other end of the detection arm 22 is fixedly connected to the peripheral portion surrounding the cavity 50 of the substrate 40 and having a frame shape.

As shown in FIG. 2, a driving electrode 111 and a driving electrode 112 are respectively disposed in regions of the oscillation arm 11 near the connecting portion 31 and the connecting portion 32. Similarly, a driving electrode 121 and a driving electrode 122 are respectively disposed in regions of the oscillation arm 12 close to the connecting portion 31 and the connecting portion 32. Each of the driving electrodes 111, 112, 121 and 122 includes a first application electrode 101 and a second application electrode 102 disposed to face each other on the oscillation arms 11 and 12. The first application electrode 101 is disposed at a side (hereinafter, referred to as the "inner side") in which the oscillation arm 11 and the oscillation arm 12 face each other, and the second application electrode 102 is disposed at the other side (hereinafter, referred to as the "outer side") opposite the inner side.

A detection electrode 211 is disposed in a region close to the fixed end of the detection arm 21, and a detection electrode 221 is disposed in a region close to the fixed end of the detection arm 22. Each of the detection electrodes 211 and 221 includes detecting electrodes 201 and 202 disposed to face each other. As shown in FIG. 2, the detecting electrode 201 of the detection arm 21 and the detecting electrode 202 of the detection arm 22 are disposed in regions close to the oscillation arm 12, and the detecting electrode 202 of the detection arm 21 and the detecting electrode 201 of the detection arm 22 are disposed in regions close to the oscillation arm 11.

An oscillation reference electrode 71 is disposed in the vicinity of the connecting portion 31, and an oscillation reference electrode 72 is disposed in the vicinity of the connecting portion 32.

Figure 3:
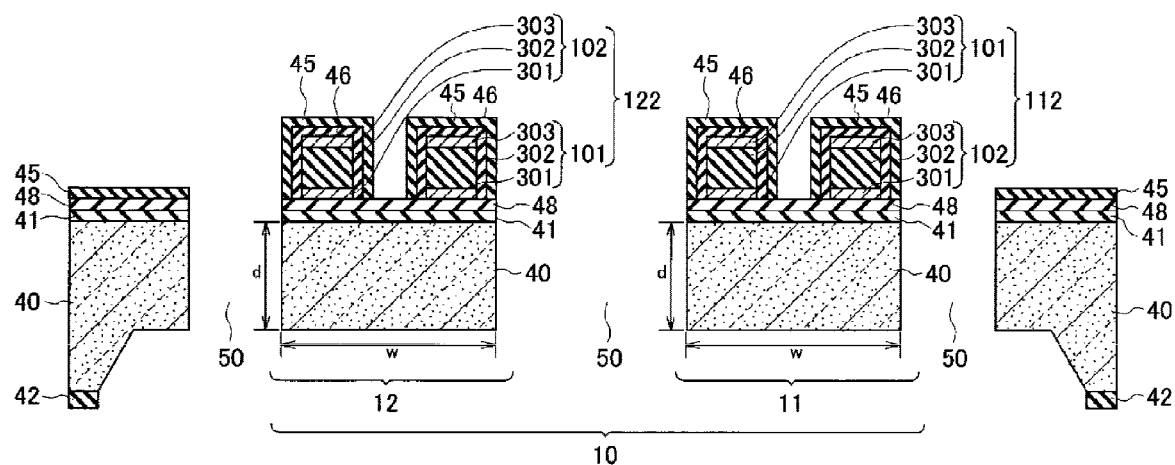
FIG. 3 illustrates a cross-sectional view of a schematic structure taken along line I-I of FIG. 2.

FIG. 3 is a cross-sectional view showing the structure of the oscillation arms 11 and 12 taken along line I-I of FIG. 2. As shown in FIG. 3, the first application electrode 101 and the second application electrode 102 are arranged to face each other in the regions close to the sides of the oscillation arms 11 and 12. The first application electrode 101 and the second application electrode 102 have the same layer structure.

Figure 4:
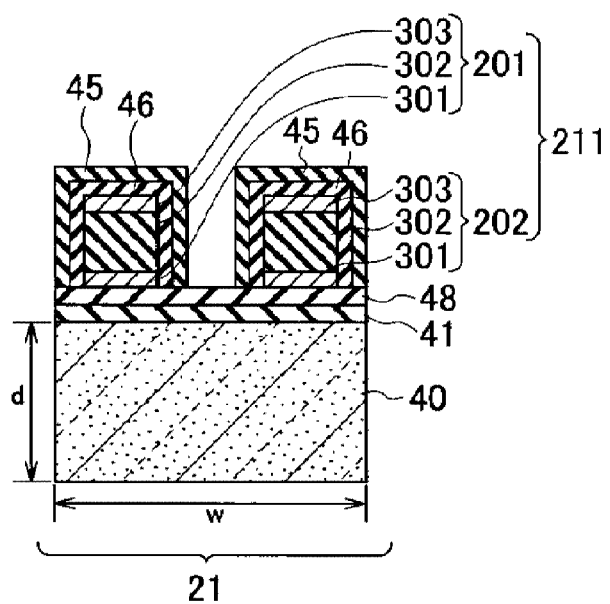
FIG. 4 illustrates a cross-sectional view of a schematic structure taken along line II-II of FIG. 2.

FIG. 4 is a cross-sectional view showing the structure of the detection arm 21 taken along line II-II of FIG. 2. As shown in FIG. 4, the detecting electrodes 201 and 202, having the same layer structure, are arranged to face each other in the regions close to the sides of the detection arm 21. Although not shown, the structure of the detection arm 22 is the same as that of the detection arm 21. In addition, as shown in FIG. 2, the arrangement of the detecting electrode 201 and the detecting electrode 202 in the x-axis direction on the detection arm 22 is opposite that of the detection arm 21.

As shown in FIGS. 2 to 4, the oscillation arms 11 and 12 and the detection arms 21 and 22 constitute a double tuning fork type oscillator 10 disposed in the cavity 50 of the substrate 40. As will be described below, the oscillation arms 11 and 12 and the detection arms 21 and 22 are formed by leaving a portion of the substrate 40 when the cavity 50 is formed by etching the substrate 40.

As the substrate 40, a silicon substrate or the like may be employed. A width w of the substrate 40 of the oscillation arms 11 and 12 and the detection arms 21 and 22 is about, for example, 150 μm, and a film thickness d of the substrate 40 of the oscillation arms 11 and 12 and the detection arms 21 and 22 is about, for example, 150 μm.

As shown in FIGS. 3 and 4, each of the first application electrode 101, the second application electrode 102 and the detecting electrodes 201 and 202 is a laminated body of the lower electrode layer 301, the piezoelectric film layer 302 and the upper electrode layer 303. As the lower electrode layer 301, a laminated film of platinum (Pt)/titanium (Ti) having a film thickness of about 200 nm or the like may be employed. As the upper electrode layer 303, a laminated film of iridium oxide ($IrO_2$)/iridium (Ir) or gold (Au) film having a film thickness of about 200 nm or the like may be employed. As the piezoelectric film layer 302, a lead zirconate titanate (PZT) film or lanthanum-doped lead zirconate titanate (PLZT) film having a film thickness of about 1 to 3 μm or the like may be employed. The PZT film or PLZT film may be formed by a sol-gel method or the like.

In the first application electrode 101, the second application electrode 102 and the detecting electrodes 201 and 202, the lower electrode layer 301 is disposed on the silicon oxide film 41 formed on the substrate 40 through the first aluminum oxide film 48. Further, the laminated body of the lower electrode layer 301, the piezoelectric film layer 302 and the upper electrode layer 303 is covered with the passivation film 45 through the second aluminum oxide film 46. The silicon oxide film 41 is formed, for example, by thermally oxidizing the surface of the substrate 40. The passivation film 45 is formed of, for example, a silicon oxide ($SiO_2$) film.

When a driving voltage Vd is applied as a driving signal between the first application electrode 101 and the second application electrode 102, the shape of the piezoelectric film layer 302 of the first application electrode 101 and the second application electrode 102 is deformed by an inverse piezoelectric effect. For example, the piezoelectric film layer 302 contracts in the y-axis direction when a positive voltage is applied, and expands in the y-axis direction when a negative voltage is applied. Accordingly, by applying voltages having different polarities to the first application electrode 101 and the second application electrode 102 located in the regions close to the sides of the oscillation arms 11 and 12, the inner side of the oscillation arms 11 and 12 contracts when the outer side of the oscillation arms 11 and 12 expands, and the outer side of the oscillation arms 11 and 12 contracts when the inner side of the oscillation arms 11 and 12 expands. That is, the oscillation arms 11 and 12 are bent in the x-axis direction.

If the shape of the detection arms 21 and 22 is changed, the shape of the piezoelectric film layer 302 of the detecting electrodes 201 and 202 is deformed, and an electrical signal is outputted as a detection signal from the detection electrodes 211 and 221 by a piezoelectric effect. The detection signal is a current signal or voltage signal outputted by the detection electrodes 211 and 221 when detecting polarization occurring in the piezoelectric film layer 302 of the detecting electrodes 201 and 202 by the piezoelectric effect.

The driving voltage Vd is outputted from a driving circuit 610 of the detection circuit 600 shown in FIG. 2 to the driving electrodes 111, 112, 121 and 122. The driving circuit 610 outputs the driving voltage Vd of a driving oscillation frequency fd. The driving oscillation frequency fd is set as a resonance frequency of the oscillator 10 in the driving oscillation direction. Further, based on the polarization occurring in the detecting electrodes 201 and 202 by applying the angular velocity to the oscillation arms 11 and 12, detection signals Sd1 and Sd2 are respectively outputted from the detection electrodes 211 and 221 to a detecting circuit 620 of the detection circuit 600.

The oscillation reference electrodes 71 and 72 have the stack structure of the lower electrode layer 301, the piezoelectric film layer 302 and the upper electrode layer 303, similarly to the driving electrodes 111, 112, 121 and 122 and the detection electrodes 211 and 221 illustrated in FIGS. 2 and 3. In the oscillation reference electrodes 71 and 72, the lower electrode layer 301 is disposed on the silicon oxide film 41 formed on the substrate 40 through the first aluminum oxide film 48, and the structure of the lower electrode layer 301, the piezoelectric film layer 302 and the upper electrode layer 303 is covered with the passivation film 45 through the second aluminum oxide film 46. Further, a reference voltage Vr proportional to the change in the shape of the oscillation arms 11 and 12 due to the driving oscillation is generated in the oscillation reference electrodes 71 and 72. That is, the magnitude of the reference voltage Vr is proportional to the magnitude of the driving oscillation. The reference voltage Vr is outputted to an oscillation amount detection circuit 640 of the detection circuit 600 from the oscillation reference electrodes 71 and 72. The oscillation amount detection circuit 640 outputs an oscillation signal $S_F$ indicating the magnitude of the driving oscillation to the driving circuit 610 based on the reference voltage Vr.

Hereinafter, an operation of the angular velocity detection apparatus 1 will be described.

When the driving voltage Vd of the driving oscillation frequency fd is applied between the first application electrode 101 and the second application electrode 102 by the driving circuit 610, as described earlier, the piezoelectric film layer 302 of the first application electrode 101 and the second application electrode 102 is deformed, and the oscillation arms 11 and 12 are bent. That is, the oscillation arms 11 and 12 are driven to oscillate in the driving oscillation direction at the driving oscillation frequency fd.

In the driving oscillation, a voltage having the same polarity is applied to the first application electrode 101 of each of the oscillation arms 11 and 12, and a voltage having an opposite polarity to that of the voltage applied to the first application electrode 101 is applied to the second application electrode 102. Accordingly, if any one of the oscillation arms 11 and 12 is bent in the +x direction, the other one is bent in the −x direction. That is, each end of the oscillation arm 11 is connected to the opposing end of the oscillation arm 12, and the oscillation arms 11 and 12 are driven to oscillate in opposite directions at the same period in time, thereby forming a part of the double tuning fork type oscillator 10. The oscillator 10 is driven to oscillate at the driving oscillation frequency fd.

Since the oscillation arms 11 and 12 are driven to oscillate in opposite directions, in a state where the oscillation arms 11 and 12 are only driven to oscillate, the center of each of the connecting portions 31 and 32, i.e., a connection point between the connecting portion 31 and the detection arm 21 and between the connecting portion 32 and the detection arm 22, becomes a fixed point without oscillating. Accordingly, shape deformation does not occur in the detection arms 21 and 22, and the detection electrodes 211 and 221 do not output the detection signals Sd1 and Sd2.

In addition, in the state where the oscillation arms 11 and 12 are driven to oscillate, if the oscillator 10 rotates around a rotation axis perpendicular to the driving oscillation plane, the oscillation arms 11 and 12 are subjected to Coriolis force.

In other words, each of the oscillation arms 11 and 12 is subjected to Coriolis force in the long-axis direction of the oscillation arms 11 and 12 (y-axis direction) perpendicular to the driving oscillation direction (x-axis direction) and the rotation axis direction (z-axis direction) of the rotation of the oscillator 10.

In the driving oscillation, the driving directions of the oscillation arms 11 and 12 are opposite to each other at the same point in time. Accordingly, the directions of the Coriolis force applied to the oscillation arms 11 and 12 are opposite to each other at the same point in time.

For example, if the oscillator 10 is rotating at an angular velocity w in a clockwise direction in the drawing plane of FIG. 2, in a state where the oscillation arm 11 is bent in the +x direction and the oscillation arm 12 is bent in the −x direction, the oscillation arm 11 is subjected to Coriolis force f1 in the +y direction, and the oscillation arm 12 is subjected to Coriolis force f2 in the −y direction. In response to changes in the driving directions of the oscillation arms 11 and 12, the directions of the Coriolis forces f1 and f2 change. Accordingly, oscillation in the in the y-axis direction (hereinafter, referred to as "detection oscillation") occurs in the oscillation arms 11 and 12 subjected to the Coriolis forces f1 and f2. The Coriolis forces f1 and f2 act in opposite directions. Further, the detection oscillation occurring in the oscillation arms 11 and 12 is an oscillation in the long-axis direction (y-axis direction) along which the oscillation arms 11 and 12 are extended. The direction of the driving oscillation and the direction of the detection oscillation form a 90 degree angle.

As described above, the directions of the detection oscillation occurring in the oscillation arms 11 and 12 at the same point in time are opposite to each other. As a result, the shape deformation caused by the detection oscillation occurs in the detection arm 21 disposed between the connecting portion 31 and the substrate 40, and the detection arm 22 disposed between the connecting portion 32 and the substrate 40.

If shape deformation occurs in the detection arms 21 and 22, the shape of the piezoelectric film layer 302 of the detecting electrodes 201 and 202 is deformed, and polarization occurs in the piezoelectric film layer 302. The detection electrodes 211 and 221 detect a current (detection current) flowing between the detecting electrodes 201 and 202 by the polarization occurring in the piezoelectric film layer 302 or a voltage (detection voltage) generated between the detecting electrodes 201 and 202. The detection electrodes 211 and 221 output the detection current or detection voltage (detection signals Sd1 and Sd2) to the detection circuit 600.

The detection circuit 600 detects the angular velocity applied to the oscillation arms 11 and 12 based on the detection signals Sd1 and Sd2 outputted by the detection electrodes 211 and 221.

As explained earlier, the driving circuit 610 outputs the driving voltage Vd of the driving oscillation frequency fd, but the driving oscillation frequency fd is set with reference to the oscillation signal $S_F$ indicating the magnitude of the driving oscillation, which is outputted to the driving circuit 610 from the oscillation amount detection circuit 640. The oscillation amount detection circuit 640 includes a current amplifier and automatic gain control circuit (AGC). The reference voltage Vr generated in the oscillation reference electrodes 71 and 72 by the driving oscillation of the oscillation arms 11 and 12 is inputted to the AGC through the current amplifier. An output of the AGC is inputted to the driving circuit 610 as the oscillation signal $S_F$ indicating the magnitude of the driving oscillation.

The driving circuit 610 sets, as the resonance frequency of the oscillator 10, the driving oscillation frequency fd at which the magnitude of the driving oscillation is the greatest based on the oscillation signal $S_F$, and the driving oscillation frequency fd of the driving voltage Vd is determined. That is, the magnitude of the driving oscillation is fed back to the driving circuit 610 from the oscillator 10, thereby setting the driving oscillation frequency fd.

The detecting circuit 620 includes current amplifiers and a differential amplifier. The detection signal Sd1 is inputted to the current amplifier connected to the detection electrode 211, and the detection signal Sd2 is inputted to the current amplifier connected to the detection electrode 221. The outputs of the current amplifiers are inputted to the differential amplifier, and a signal obtained by superimposing the detection signals Sd1 and Sd2 is transmitted, as a detecting signal $S_T$, to a detector circuit 630.

The detection signals Sd1 and Sd2 oscillate at an oscillation frequency of the oscillator 10. By superimposing the detection signals Sd1 and Sd2, the detecting signal $S_T$ is amplified and, at the same time, noise included in the detection signals Sd1 and Sd2 is removed. Thus, it is possible to detect a change in the shape of the piezoelectric film layer 302 with higher sensitivity.

The detector circuit 630 includes a synchronous detection and smoothing circuit. The detector circuit 630 synchronously detects the detecting signal $S_T$ transmitted from the detecting circuit 620 by using the driving oscillation frequency fd at which the oscillation signal $S_F$ is transmitted from the oscillation amount detection circuit 640 to calculate the angular velocity ω. The calculated angular velocity w is outputted as an output signal D1 from the detector circuit 630.

The detection circuit 600 may be formed on a substrate different from the substrate 40, and the detection circuit 600 may be formed on the substrate 40. By forming the oscillator 10 and the detection circuit 600 on the substrate 40 in one chip, it is possible to reduce the size of the angular velocity detection apparatus 1.

As described above, in the angular velocity detection apparatus 1 using the piezoelectric thin film structure in accordance with the embodiments, since the direction of oscillation of the oscillation arms 11 and 12 is different from the direction of oscillation of the detection arms 21 and 22 by the Coriolis force, the driving oscillation is not transmitted to the detection arms 21 and 22. Further, the direction of the driving oscillation of the oscillation arms 11 and 12 is different by 90 degrees from the direction of the detection oscillation of the detection arms 21 and 22 when the angular velocity is applied to the oscillator 10. Accordingly, since the resonant modes have different axes of the oscillation noise and the detection oscillation, although the angular velocity is applied to the oscillator 10 while oscillation noise occurs, the oscillation noise does not affect the detection signals Sd1 and Sd2 according to the angular velocity. Further, in the angular velocity detection apparatus 1, the oscillation arms 11 and 12 oscillate in opposite directions. Accordingly, it is difficult to transmit the driving oscillation to the detection arms 21 and 22 connected to the connecting portions 31 and 32, which are fixed points for the driving oscillation. Thus, in the angular velocity detection apparatus 1, even though the oscillation noise is large, an S/N ratio does not deteriorate, and the sensitivity of detecting the angular velocity is not reduced. In other words, according to the angular velocity detection apparatus 1 shown in FIG. 2, it is possible to provide an angular velocity detection apparatus capable of reducing an impact of oscillation noise.

Further, in the angular velocity detection apparatus 1, it is possible to detect the angular velocity of the rotation around a rotation axis that is normal to the main surface of the substrate 40, which is difficult to detect in a conventional angular velocity detection apparatus.

(Remanent Polarization Value of Piezoelectric Film Layer)

Figure 5:
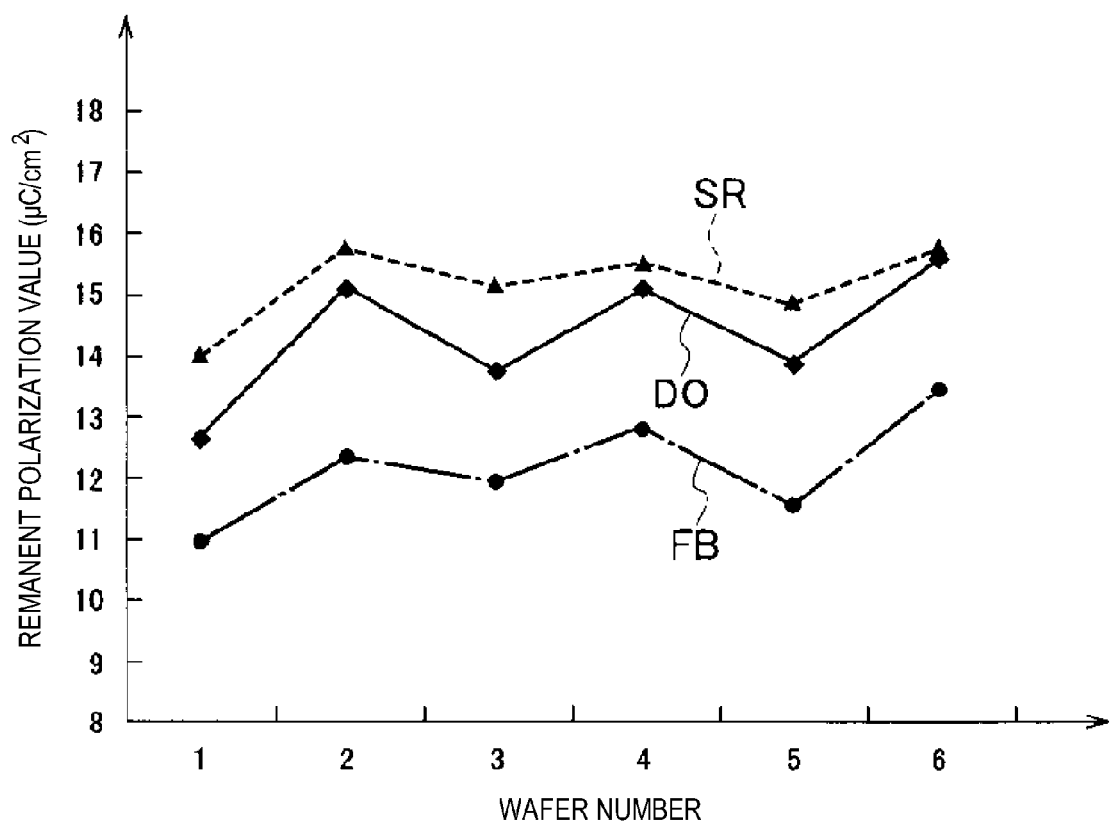
FIG. 5 illustrates a relationship between a wafer number and a remanent polarization value in a piezoelectric film layer in each part of the angular velocity detection apparatus using the piezoelectric thin film structure in accordance with the embodiments.

In the angular velocity detection apparatus 1 using the piezoelectric thin film structure in accordance with the embodiments, a relationship between a wafer number and a remanent polarization value in the piezoelectric film layer 302 in each of the oscillation reference electrode FB, the driving electrode DO, and the detection electrode SR is represented, as shown in FIG. 5.

In FIG. 5, wafer numbers 1 to 3 correspond to samples including the silicon oxide film 41 having a thickness of 8,000 angstroms, and wafer numbers 4 to 6 correspond to samples including the silicon oxide film 41 having a thickness of 1,800 angstroms. Further, wafer numbers 1, 3 and 5 correspond to samples including the first aluminum oxide film 48 having a thickness of zero and the second aluminum oxide film 46 having a thickness of 40, 80 and 80 nm, respectively. Wafer numbers 2, 4 and 6 correspond to samples including the first aluminum oxide film 48 having a thickness of 40 nm and the second aluminum oxide film 46 having a thickness of 40, 40 and 80 nm, respectively.

Comparing wafer number 1 with wafer number 2, in the sample of wafer number 2 including the first aluminum oxide film 48, the remanent polarization value in the piezoelectric film layer 302 has increased in each of the oscillation reference electrode FB, the driving electrode DO and the detection electrode SR.

Comparing wafer number 3 with wafer number 4, in the sample of wafer number 4 including the first aluminum oxide film 48, the remanent polarization value in the piezoelectric film layer 302 has increased in each of the oscillation reference electrode FB, the driving electrode DO and the detection electrode SR.

Comparing wafer number 5 with wafer number 6, in the sample of wafer number 6 including the first aluminum oxide film 48, the remanent polarization value in the piezoelectric film layer 302 has increased in each of the oscillation reference electrode FB, the driving electrode DO and the detection electrode SR.

Figure 6:
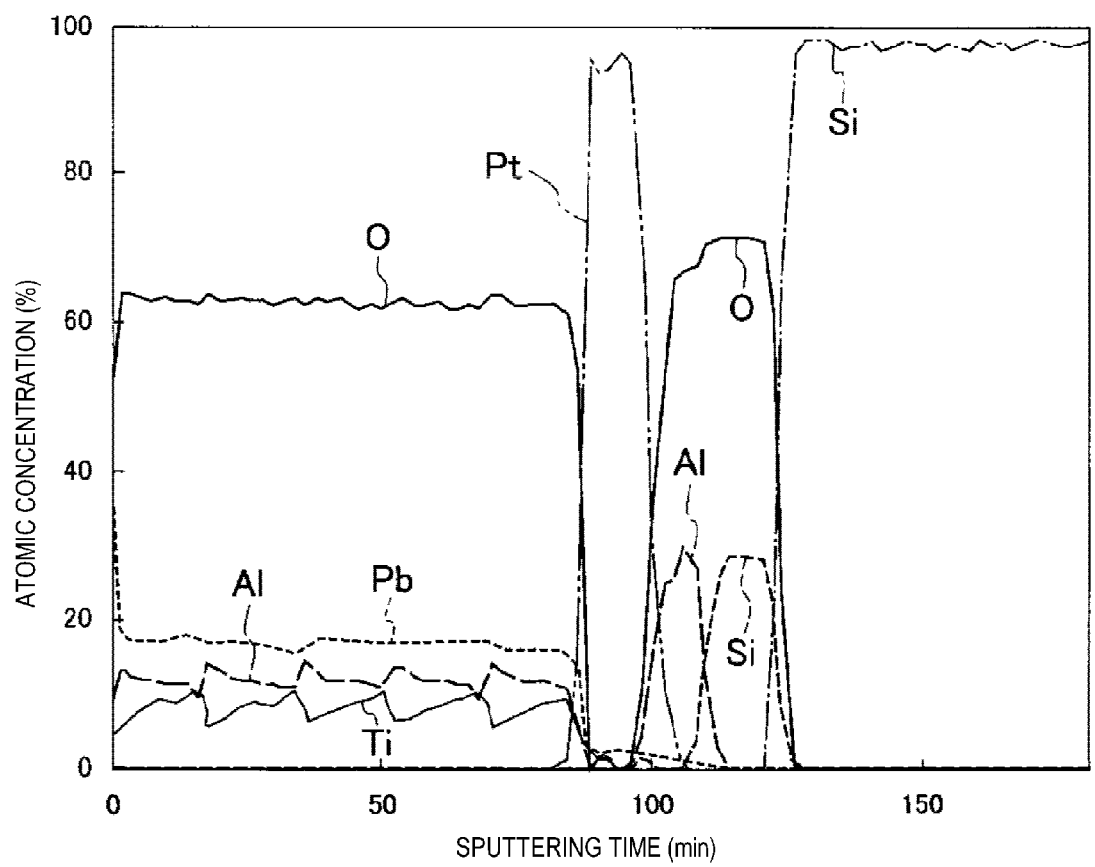
FIG. 6 illustrates the measurement results of X-ray photoelectron spectroscopy (XPS) showing a relationship between sputtering time (min.) and atomic concentration (%) of a stack structure of PZT/Pt/Al$_2$O$_3$/SiO$_2$/Si in the angular velocity detection apparatus using the piezoelectric thin film structure in accordance with the embodiments.

In the angular velocity detection apparatus 1 using the piezoelectric thin film structure in accordance with the embodiments, the measurement results of X-ray photoelectron spectroscopy (XPS) showing a relationship between sputtering time (min.) and atomic concentration (%) of the stack structure of $PZT/Pt/Al_2O_3/SiO_2/Si$ are represented, as shown in FIG. 6. As may be clearly seen from FIG. 6, the diffusion of Pb in the PZT is suppressed by the $Al_2O_3$ film, and the diffusion of Pb has hardly occurred into the $SiO_2$ film.

According to the embodiments, it is possible to provide the angular velocity detection apparatus 1 using the piezoelectric thin film structure whose piezoelectric properties are stabilized by suppressing the diffusion of Pb from the PZT film.

(Manufacturing Method)

A manufacturing method of the angular velocity detection apparatus 1 using the piezoelectric thin film structure in accordance with the embodiments will now be described with reference to FIGS. 7 to 11. FIGS. 7 to 11 are cross-sectional views showing steps of the manufacturing method, which are taken along line I-I of FIG. 2. Further, the manufacturing method of the angular velocity detection apparatus 1 described below is merely exemplary, and various manufacturing methods other than the described method, including its modifications, can be realized.

Figure 7:
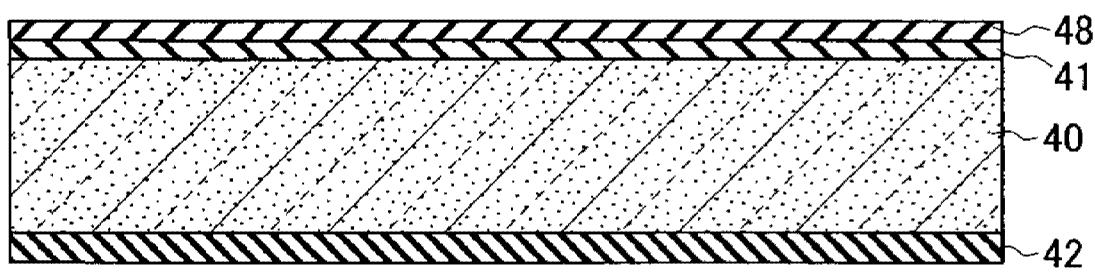
FIG. 7 is an explanatory diagram showing a first step of a manufacturing method of the angular velocity detection apparatus using the piezoelectric thin film structure in accordance with the embodiments, and is a cross-sectional view of a first schematic structure taken along line I-I of FIG. 2.

(a) As shown in FIG. 7, the silicon oxide film 41 is formed on the surface of the substrate 40, which is a silicon substrate having a thickness of about 700 μm, and a silicon oxide film 42 is formed on the backside of the substrate 40. The silicon oxide film 41 and the silicon oxide film 42 are formed by thermal oxidation.

(b) Then, as shown in FIG. 7, the first aluminum oxide film 48 is formed on the silicon oxide film 41 on the surface of the substrate 40.

Figure 8:
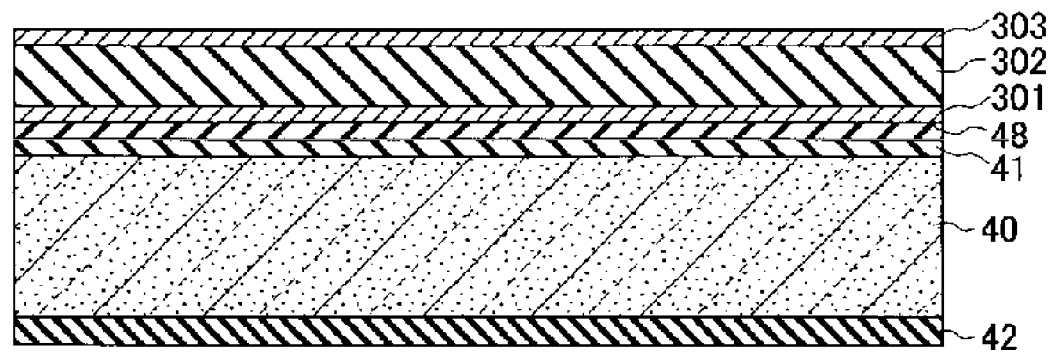
FIG. 8 is an explanatory diagram showing a second step of the manufacturing method of the angular velocity detection apparatus using the piezoelectric thin film structure in accordance with the embodiments, and is a cross-sectional view of a second schematic structure taken along line I-I of FIG. 2.

(c) Then, as shown in FIG. 8, the lower electrode layer 301, the piezoelectric film layer 302 and the upper electrode layer 303 are sequentially stacked on the first aluminum oxide film 48. By a sputtering method, for example, a laminated film of Pt/Ti having a film thickness of about 200 nm is formed as the lower electrode layer 301. On the lower electrode layer 301, for example, a PLZT film is formed as the piezoelectric film layer 302 by a sol-gel method or the like. On the piezoelectric film layer 302, for example, a laminated film of $IrO_2/Ir$ in which the $IrO_2$ film is a lower layer is formed as the upper electrode layer 303 by a sputtering method.

Figure 9:
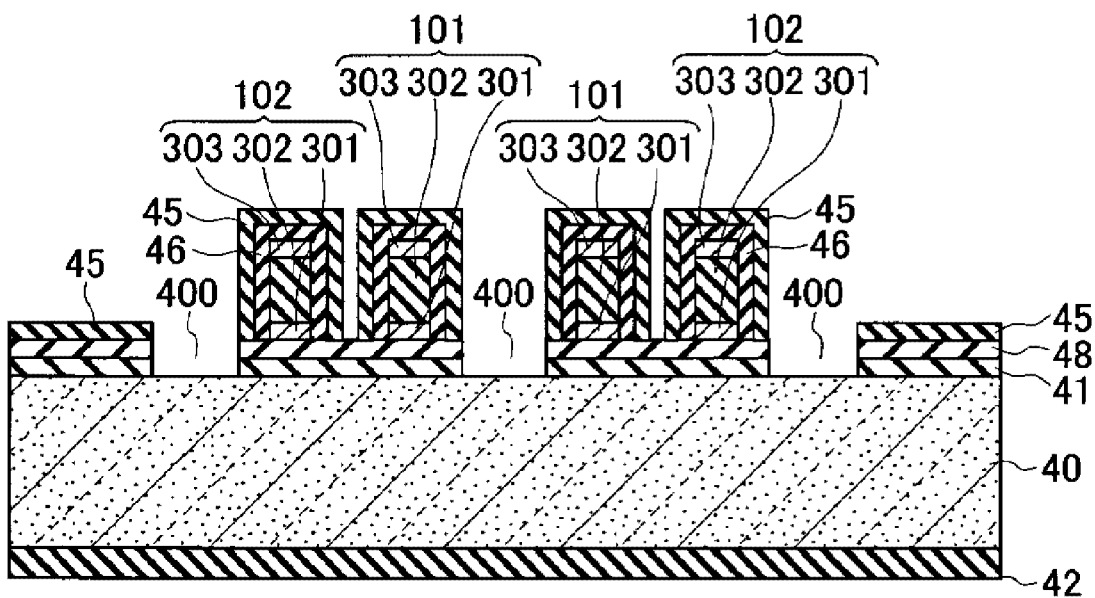
FIG. 9 is an explanatory diagram showing a third step of the manufacturing method of the angular velocity detection apparatus using the piezoelectric thin film structure in accordance with the embodiments, and is a cross-sectional view of a third schematic structure taken along line I-I of FIG. 2.

(d) Then, as shown in FIG. 9, the lower electrode layer 301, the piezoelectric film layer 302 and the upper electrode layer 303 are patterned into a desired pattern by photolithography, etching or the like, thereby forming the first application electrode 101 and the second application electrode 102 in which the lower electrode layer 301, the piezoelectric film layer 302 and the upper electrode layer 303 are stacked. Although not shown, in the same manner as the first application electrode 101 and the second application electrode 102, the detecting electrodes 201 and 202 are also formed at the same time.

(e) Then, as shown in FIG. 9, the second aluminum oxide film 46 and the passivation film 45 are formed. Subsequently, the passivation film 45, the first aluminum oxide film 48 and the silicon oxide film 41 in a region 400, where the cavity 50 is formed, are removed.

Figure 10:
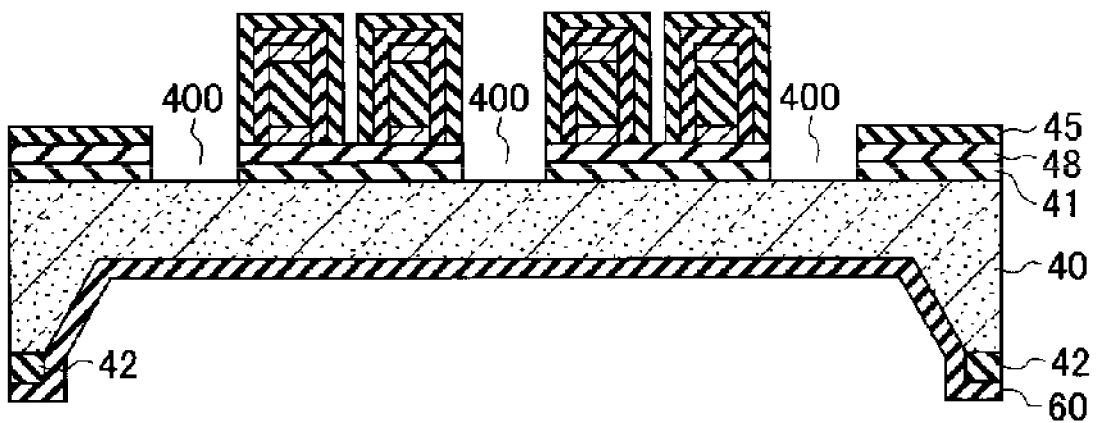
FIG. 10 is an explanatory diagram showing a fourth step of the manufacturing method of the angular velocity detection apparatus using the piezoelectric thin film structure in accordance with the embodiments, and is a cross-sectional view of a fourth schematic structure taken along line I-I of FIG. 2.

(f) Then, as shown in FIG. 10, a portion of the silicon oxide film 42 formed on the backside of the substrate 40 is etched to expose the backside of the substrate 40 in the regions where the oscillator 10 and the cavity 50 are formed. Wet etching is performed using the remaining silicon oxide film 42 as an etching mask to remove a portion of the backside of the substrate 40 corresponding to the region where the oscillator 10 is disposed and the region where the cavity 50 is formed. As a result, the backsides of the oscillation arms 11 and 12 and the detection arms 21 and 22 are exposed. Then, as shown in FIG. 10, a silicon oxide film 60 is formed as an etching stopper on the backside of the substrate 40 by plasma chemical vapor deposition (PCVD) or the like.

Figure 11:
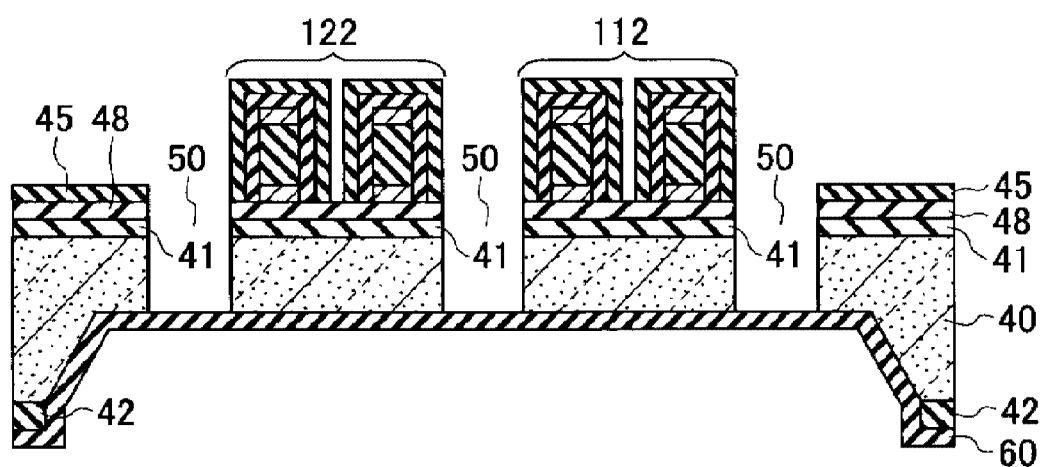
FIG. 11 is an explanatory diagram showing a fifth step of the manufacturing method of the angular velocity detection apparatus using the piezoelectric thin film structure in accordance with the embodiments, and is a cross-sectional view of a fifth schematic structure taken along line I-I of FIG. 2.

(g) Then, as shown in FIG. 11, dry etching is performed using the passivation film 45 as an etching mask and the silicon oxide film 60 as an etching stopper to remove a portion of the surface of the substrate 40 and form the cavity 50, thereby exposing the side surfaces of the oscillation arms 11 and 12 and the detection arms 21 and 22. Then, the silicon oxide film 60 is removed. Using the method described above, the angular velocity detection apparatus 1 shown in FIGS. 2 to 4 is completed.

(Another Manufacturing Method)

In the above description, a case where the silicon oxide film 60 is formed as an etching stopper on the backside of the substrate 40 has been explained. However, as will be described below with reference to FIGS. 12 to 16, an insulating film serving as an etching stopper may be formed on the substrate 40 in advance. FIGS. 12 to 16 are cross-sectional views showing the steps of the manufacturing method, which are taken along line I-I of FIG. 2.

Figure 12:
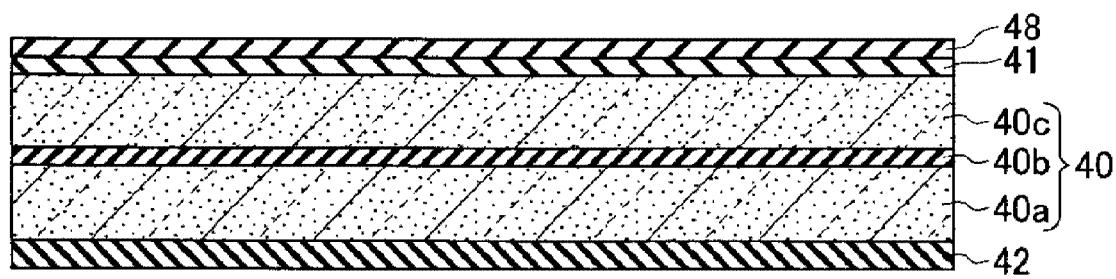
FIG. 12 is an explanatory diagram showing a first step of another manufacturing method of the angular velocity detection apparatus using the piezoelectric thin film structure in accordance with the embodiments, and is a cross-sectional view of a first schematic structure taken along line I-I of FIG. 2.

(a) As shown in FIG. 12, an SOI (silicon on insulator) substrate on which a silicon film 40*a*, a silicon oxide film 40*b* and a silicon film 40*c* are stacked is prepared as the substrate 40. Further, the silicon oxide film 41 is formed on the surface of the substrate 40, i.e., the silicon film 40c, and the silicon oxide film 42 is formed on the backside of the substrate 40, i.e., the silicon film 40a. The silicon oxide film 41 and the silicon oxide film 42 are formed by thermal oxidation.

(b) Then, as shown in FIG. 12, the first aluminum oxide film 48 is formed on the silicon oxide film 41 on the surface of the substrate 40, i.e., the silicon film 40c.

Figure 13:
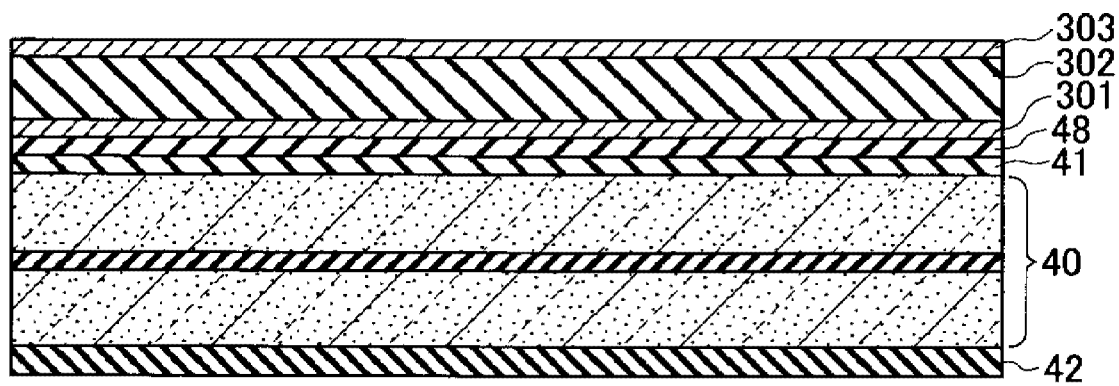
FIG. 13 is an explanatory diagram showing a second step of the other manufacturing method of the angular velocity detection apparatus using the piezoelectric thin film structure in accordance with the embodiments, and is a cross-sectional view of a second schematic structure taken along line I-I of FIG. 2.

(c) Then, as shown in FIG. 13, the lower electrode layer 301, the piezoelectric film layer 302 and the upper electrode layer 303 are sequentially stacked on the first aluminum oxide film 48. By a sputtering method, for example, a laminated film of Pt/Ti having a film thickness of about 200 nm is formed as the lower electrode layer 301. On the lower electrode layer 301, for example, a PLZT film is formed as the piezoelectric film layer 302 by a sol-gel method or the like. On the piezoelectric film layer 302, for example, a laminated film of $IrO_2/Ir$ in which the $IrO_2$ film is a lower layer is formed as the upper electrode layer 303 by a sputtering method.

Figure 14:
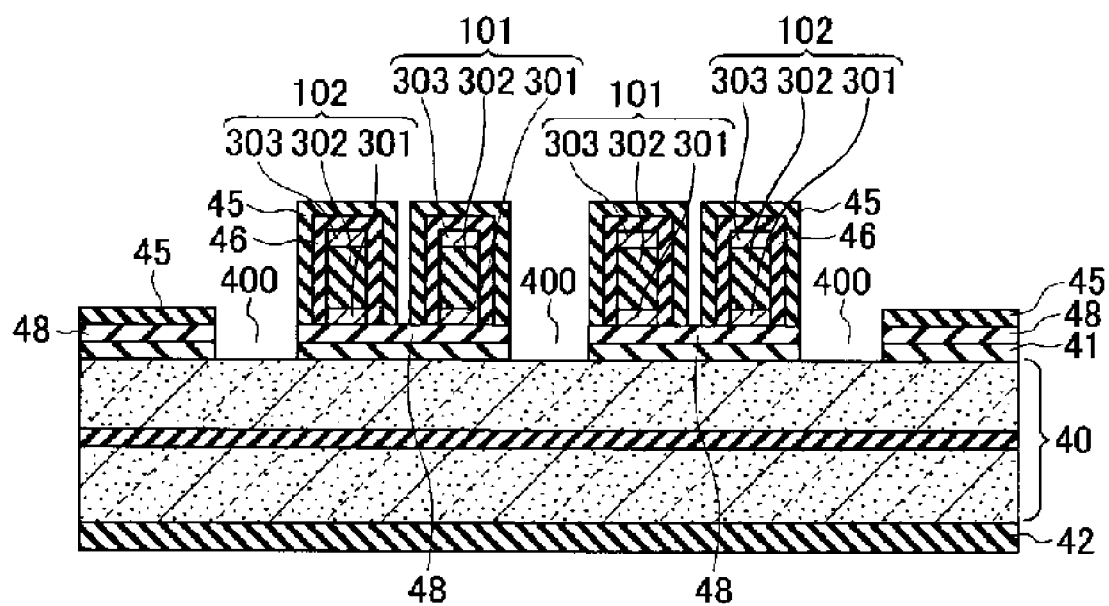
FIG. 14 is an explanatory diagram showing a third step of the other manufacturing method of the angular velocity detection apparatus using the piezoelectric thin film structure in accordance with the embodiments, and is a cross-sectional view of a third schematic structure taken along line I-I of FIG. 2.

(d) Then, as shown in FIG. 14, the lower electrode layer 301, the piezoelectric film layer 302 and the upper electrode layer 303 are patterned into a desired pattern by photolithography, etching or the like, thereby forming the first application electrode 101 and the second application electrode 102 in which the lower electrode layer 301, the piezoelectric film layer 302 and the upper electrode layer 303 are stacked. Although not shown, in the same manner as the first application electrode 101 and the second application electrode 102, the detecting electrodes 201 and 202 are also formed at the same time.

(e) Then, as shown in FIG. 14, the second aluminum oxide film 46 and the passivation film 45 are formed on the entire surface. Subsequently, the passivation film 45, the first aluminum oxide film 48 and the silicon oxide film 41 in the region 400, where the cavity 50 is formed, are removed.

Figure 15:
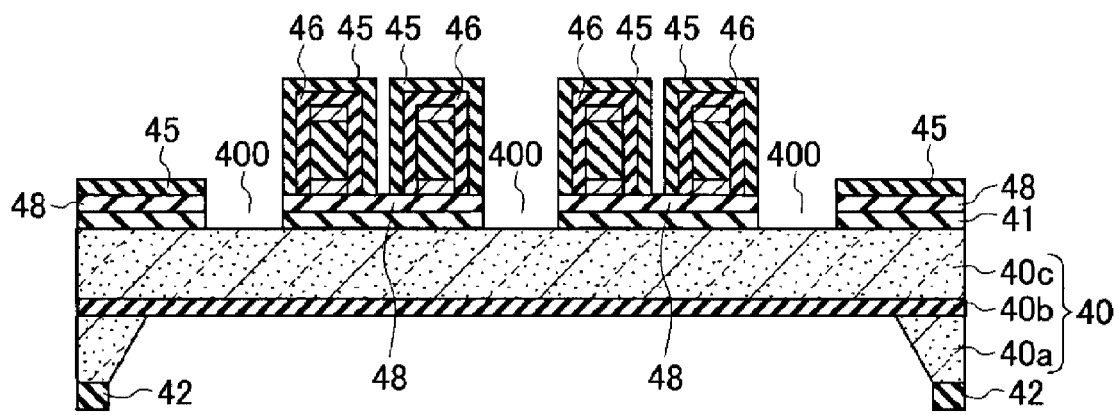
FIG. 15 is an explanatory diagram showing a fourth step of the other manufacturing method of the angular velocity detection apparatus using the piezoelectric thin film structure in accordance with the embodiments, and is a cross-sectional view of a fourth schematic structure taken along line I-I of FIG. 2.

(f) Then, as shown in FIG. 15, a portion of the silicon oxide film 42 formed on the backside of the substrate 40 is etched by using photolithography or the like to expose the silicon film 40a in the regions where the oscillator 10 and the cavity 50 are formed. Wet etching is performed using the remaining silicon oxide film 42 as an etching mask to remove the exposed silicon film 40a. As a result, the silicon oxide film 40b is exposed in the region where the oscillator 10 is disposed and the region where the cavity 50 is formed.

Figure 16:
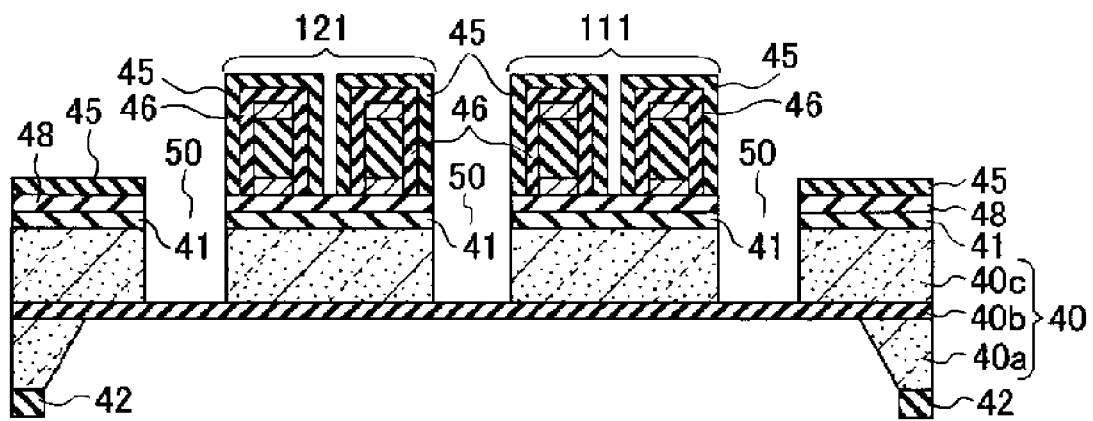
FIG. 16 is an explanatory diagram showing a fifth step of the other manufacturing method of the angular velocity detection apparatus using the piezoelectric thin film structure in accordance with the embodiments, and is a cross-sectional view of a fifth schematic structure taken along line I-I of FIG. 2.

(g) Then, as shown in FIG. 16, dry etching is performed using the passivation film 45 as an etching mask and the silicon oxide film 40b as an etching stopper to remove the silicon film 40c in the region where the cavity 50 is formed, thereby exposing the side surfaces of the oscillation arms 11 and 12 and the detection arms 21 and 22. Then, the silicon oxide film 40b in the region of the cavity 50 is removed. Using the method described above, the angular velocity detection apparatus 1 using the piezoelectric thin film structure in accordance with the embodiments is completed.

According to another manufacturing method of the angular velocity detection apparatus 1 using the piezoelectric thin film structure in accordance with the embodiments, the oscillation arms 11 and 12 performing the driving oscillation are different from the detection arms 21 and 22 performing the detection oscillation. The direction of the driving oscillation of the oscillation arms 11 and 12 is different by 90 degrees from the direction of the detection oscillation of the detection arms 21 and 22. Accordingly, it is possible to provide the angular velocity detection apparatus 1 capable of reducing an impact of oscillation noise.

Further, in the angular velocity detection apparatus 1 using the piezoelectric thin film structure in accordance with the embodiments, the oscillator 10 may include a slit in the oscillation arms 11 and 12 and the detection arms 21 and 22. The slit is a cavity passing from the upper surface to the lower surface of the oscillation arms 11 and 12 and the detection arms 21 and 22. Compared with an arm having no slit, as in the oscillation arms 11 and 12 and the detection arms 21 and 22 of the oscillator 10 shown in FIG. 2, an arm having the slit is more easily deformed. Accordingly, in the oscillator 10 having the slit, a change in the shape of the oscillation arms 11 and 12 and the detection arms 21 and 22 when the angular velocity is applied is larger than that in the oscillator 10 shown in FIG. 2, and the detection signals Sd1 and Sd2 become larger. As a result, the angular velocity detection sensitivity of the angular velocity detection apparatus 1 can be improved.

In an angular velocity detection apparatus in which driving electrodes and detection electrodes are arranged side by side on one arm, an area on which the electrodes are arranged on the arm is small. Accordingly, it is difficult to form a slit. However, in the angular velocity detection apparatus 1 using the piezoelectric thin film structure in accordance with the embodiments, since the driving electrodes and the detection electrodes are arranged on different arms, it is possible to form the slit in the oscillation arms 11 and 12 and the detection arms 21 and 22.

According to the present embodiments, it is possible to provide a piezoelectric thin film structure whose piezoelectric properties are stabilized and an angular velocity detection apparatus using the piezoelectric thin film structure, capable of reducing an impact of oscillation noise and improving an S/N ratio.

OTHER EMBODIMENTS

As described above, although the present disclosure has been described using some embodiments, the description and the drawings forming a part of the present disclosure should not be understood as limitations of the present disclosure. From the present disclosure, various alternative embodiments, examples and operational techniques will become apparent to those skilled in the art.

In the above description of the embodiments, a case where the lower electrode layer 301 and the piezoelectric film layer 302 are disconnected between the first application electrode 101 and the second application electrode 102 and between the detecting electrodes 201 and 202 has been illustrated. However, the lower electrode layer 301 or the piezoelectric film layer 302 may be formed continuously between the first application electrode 101 and the second application electrode 102 or between the detecting electrodes 201 and 202. By not cutting the piezoelectric film layer 302 of an etch-retardant material between the electrodes facing each other, the angular velocity detection apparatus 1 can be further miniaturized.

Thus, the present disclosure may include various other embodiments that are not described herein. Therefore, the technical scope of the present disclosure shall be determined by specific matters according to the appended claims appropriate from the above description.

The piezoelectric thin film structure and the angular velocity detection apparatus of the present disclosure are applicable to an angular velocity sensor, still camera, angular velocity sensor for correcting hand-shaking of a video camera, angle sensor for car navigation, motion sensor, gyro sensor, or inkjet printer.

With the embodiments of the present disclosure, it is possible to provide a piezoelectric thin film structure whose piezoelectric properties are stabilized by suppressing diffusion of Pb from a PZT film and an angular velocity detection apparatus using the piezoelectric thin film structure, capable of reducing an impact of oscillation noise and improving an S/N ratio.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. An angular velocity detection apparatus comprising:
a substrate having a cavity;
first and second oscillation arms arranged in parallel in the cavity, the first and second oscillation arms oscillating in opposite directions along a driving oscillation direction perpendicular to a thickness direction of the substrate and orthogonal to a long-axis direction along which the first and second oscillation arms are extended;
first and second connecting portions configured to connect the first and second oscillation arms, one end of the first oscillation arm being connected to an opposing end of the second oscillation arm through the first connecting portion and the other end of the first oscillation arm being connected to an opposing end of the second oscillation arm through the second connecting portion;
first and second detection arms, the first detection arm having one end connected to the first connecting portion and the other end fixed to a peripheral portion surrounding the cavity of the substrate, and the second detection arm having one end connected to the second connecting portion and the other end fixed to the peripheral portion of the substrate; and
a detection circuit which detects shape deformation of the first and second detection arms caused by oscillation of the first and second oscillation arms in the long-axis direction and detects an angular velocity applied to the first and second oscillation arms,
wherein each of the first and second oscillation arms and the first and second detection arms include a silicon oxide film disposed on the substrate, a first aluminum oxide film disposed on the silicon oxide film, a lower electrode layer disposed on the first aluminum oxide film, a piezoelectric film layer disposed on the lower electrode layer, and an upper electrode layer disposed on the piezoelectric film layer.

2. The angular velocity detection apparatus of claim 1, further comprising a second aluminum oxide film disposed on the upper electrode layer.

3. The angular velocity detection apparatus of claim 2, wherein the second aluminum oxide film is disposed on a sidewall of a stack structure including the lower electrode layer, the piezoelectric film layer and the upper electrode layer.

4. The angular velocity detection apparatus of claim 2, further comprising a passivation film disposed on the second aluminum oxide film.

5. The angular velocity detection apparatus of claim 1, wherein the piezoelectric film layer is a lead zirconate titanate (PZT) film or lanthanum-doped lead zirconate titanate (PLZT) film.

6. The angular velocity detection apparatus of claim 1, wherein if the first and second oscillation arms rotate around a rotation axis perpendicular to an oscillation plane of the first and second oscillation arms, the detection circuit detects the shape deformation of the first and second detection arms occurring when a detected oscillation of the first and second oscillation arms, which is caused by Coriolis force acting in a direction perpendicular to the driving oscillation direction and the rotation axis, is transmitted to the first and second detection arms.

7. The angular velocity detection apparatus of claim 6, the first and second detection arms oscillate in the direction perpendicular to the driving oscillation direction and the rotation axis.

8. The angular velocity detection apparatus of claim 1, wherein the first and second oscillation arms oscillate in the driving oscillation direction by a driving voltage outputted by the detection circuit.

* * * * *